US011837316B1

(12) United States Patent
Smith et al.

(10) Patent No.: US 11,837,316 B1
(45) Date of Patent: Dec. 5, 2023

(54) APPARATUSES AND METHODS TO MASK WRITE OPERATIONS

(71) Applicant: MICRON TECHNOLOGY, INC., Boise, ID (US)

(72) Inventors: Scott E. Smith, Plano, TX (US); Harish V. Gadamsetty, Allen, TX (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 17/812,139

(22) Filed: Jul. 12, 2022

(51) Int. Cl.
*G11C 7/08* (2006.01)
*G11C 7/10* (2006.01)

(52) U.S. Cl.
CPC .............. *G11C 7/08* (2013.01); *G11C 7/1009* (2013.01); *G11C 7/1039* (2013.01); *G11C 7/1096* (2013.01)

(58) Field of Classification Search
CPC ........ G11C 7/08; G11C 7/1009; G11C 7/1039; G11C 7/1096
See application file for complete search history.

(56) References Cited

U.S. PATENT DOCUMENTS

2022/0246182 A1\* 8/2022 Wan ...................... G11C 7/1045

\* cited by examiner

*Primary Examiner* — Xiaochun L Chen
(74) *Attorney, Agent, or Firm* — Dorsey & Whitney LLP

(57) ABSTRACT

An exemplary semiconductor device includes circuitry to implement data mask operations by sending bit-specific, write enable signals (WREN) to control connection of a main or global data line to local data lines during a write operation. For example, a plurality of even sense amplifier stripes each receive a first set of WREN signals to control a corresponding passgate responsible for coupling one global data line to one local data line and a plurality of odd sense amplifier stripes each receive a second set of WREN signals to control a corresponding passgate responsible for coupling one global data line to one local data line.

21 Claims, 4 Drawing Sheets

400

(DQ#)<BL#>

| (DQ{0,1}<0,2> EVEN GAP) | (DQ{0,1}<1,3> ODD GAP) |
| (DQ{0,1}<4,6> EVEN GAP) | (DQ{0,1}<5,7> ODD GAP) |
| (DQ{2,3}<4,6> EVEN GAP) | (DQ{2,3}<5,7> ODD GAP) |
| (DQ{2,3}<0,2> EVEN GAP) | (DQ{2,3}<1,3> ODD GAP) |
| (DQ{2,3}<0,2> EVEN GAP) | (DQ{2,3}<1,3> ODD GAP) |
| (DQ{2,3}<4,6> EVEN GAP) | (DQ{2,3}<5,7> ODD GAP) |
| (DQ{0,1}<4,6> EVEN GAP) | (DQ{0,1}<5,7> ODD GAP) |
| (DQ{0,1}<0,2> EVEN GAP) | (DQ{0,1}<1,3> ODD GAP) |
| GLOBAL ROW DECODER ||
| (DQ{0,1}<0,2> EVEN GAP) | (DQ{0,1}<1,3> ODD GAP) |
| (DQ{0,1}<4,6> EVEN GAP) | (DQ{0,1}<5,7> ODD GAP) |
| (DQ{2,3}<4,6> EVEN GAP) | (DQ{2,3}<5,7> ODD GAP) |
| (DQ{2,3}<0,2> EVEN GAP) | (DQ{2,3}<1,3> ODD GAP) |
| (DQ{2,3}<0,2> EVEN GAP) | (DQ{2,3}<1,3> ODD GAP) |
| (DQ{2,3}<4,6> EVEN GAP) | (DQ{2,3}<5,7> ODD GAP) |
| (DQ{0,1}<4,6> EVEN GAP) | (DQ{0,1}<5,7> ODD GAP) |
| (DQ{0,1}<0,2> EVEN GAP) | (DQ{0,1}<1,3> ODD GAP) |

WREN<7:0>

*FIG. 4A*

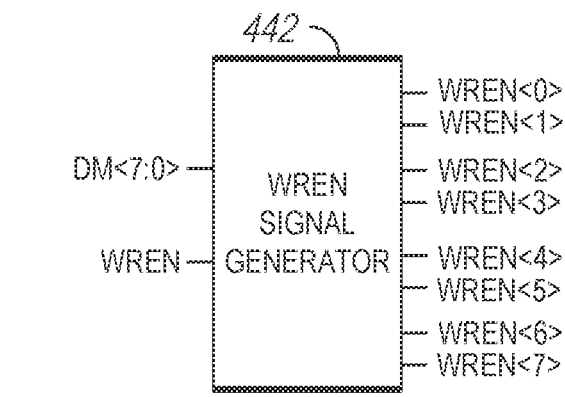

*FIG. 4B*

APPARATUSES AND METHODS TO MASK WRITE OPERATIONS

BACKGROUND OF THE INVENTION

High data reliability, high speed of memory access, low power, and reduced chip size are features that are demanded from semiconductor memory. In some applications, semiconductor memory device configurations, a data masking feature may be enabled whereby write data is received via data terminals in bursts, and a write mask signal is received in parallel that indicates whether any particular bits of the write data bursts are to be masked from being written to the memory array. To perform a write mask some implementations included disabling a global write driver and precharging global write data lines. However, introduction of voltage threshold compensated sense amplifiers has resulted in some instability, as voltage threshold compensated sense amplifiers may be more sensitive and may be come unstable when precharged global data lines are coupled to the sense amplifiers via local data lines. In some other implementations, a column select signal may be used to disable a write operation, but this implementation may restrict data terminal mapping to an array. For example, in this implementation, one column select may represent one burst bit for each data terminal, and as such if there is a column select fail, a local data line fail, or a sub wordline fail in that area of the array, it may cause all eight data terminals to fail. Such a data terminal to array mapping may be undesirable, as it reduces isolation between data terminal failures. It may be preferable to mitigate some these limitations to perform write data masking operations.

BRIEF DESCRIPTION OF THE DRAWINGS

FIG. 4A depicts an exemplary map of the data terminal write data to various control planes of a memory array, in accordance with embodiments of the disclosure.

FIG. 4B depicts an exemplary write enable signal generator configured to receive data mask signal data DM<7:0> and a WREN signal, and in response to the WREN signal, to drive the write enable signals WREN<7:0> based of the DM<7:0> data in accordance with embodiments of the disclosure.

DETAILED DESCRIPTION

Figure 1:
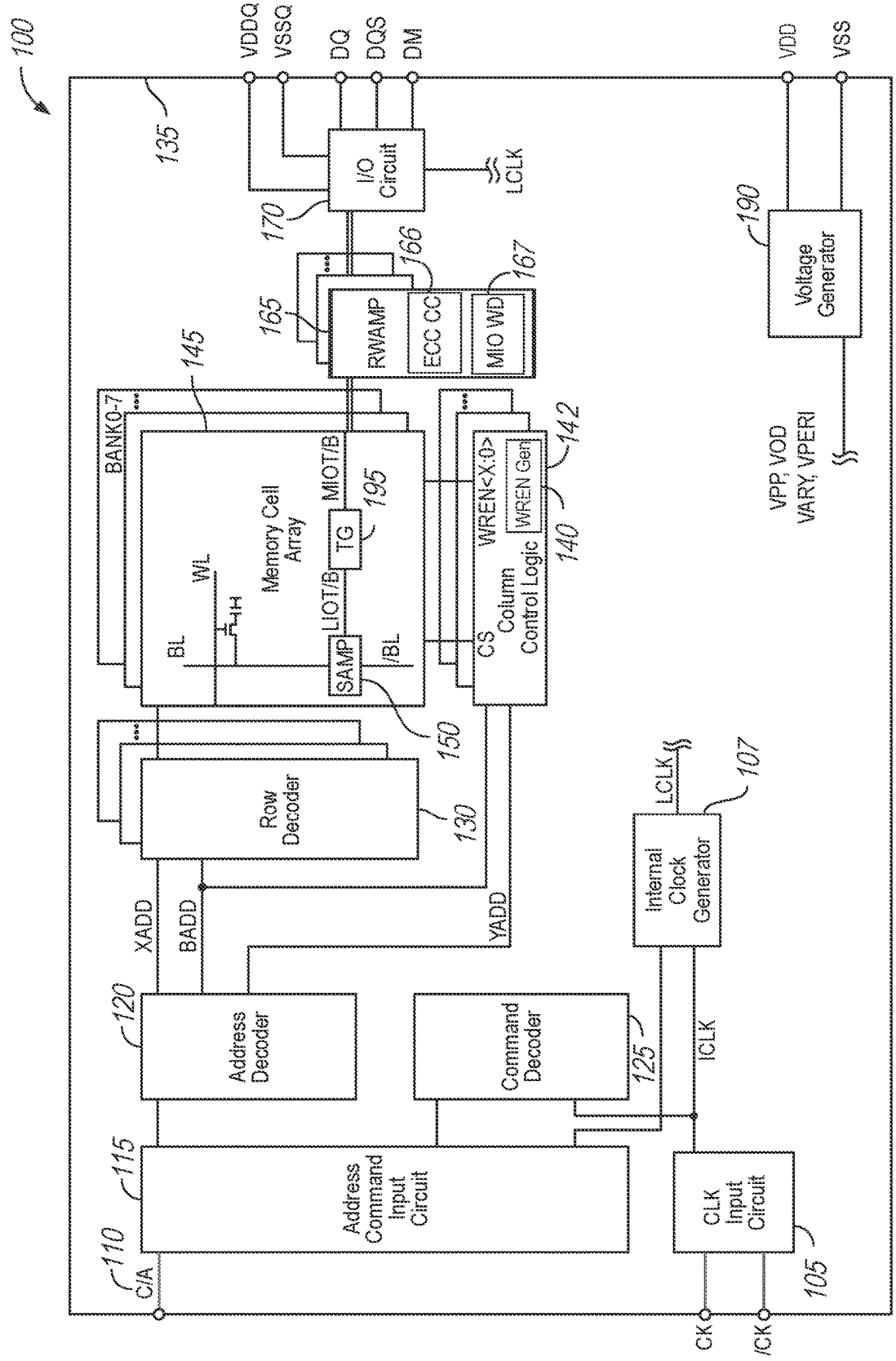
FIG. 1 is a schematic block diagram of a semiconductor device 100, in accordance with an embodiment of the present disclosure.

Certain details are set forth below to provide a sufficient understanding of embodiments of the present disclosure. However, it will be clear to one skilled in the art that embodiments of the present disclosure may be practiced without these particular details. Moreover, the particular embodiments of the present disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring the disclosure.

Some of the material described in this disclosure include circuitry and techniques for implementing data mask operations by sending bit-specific, write enable signals (WREN) to control connection of a main or global data line to local data lines during a write operation. For example each sense amplifier stripe may receive four WREN signals, and each respective WREN signal would control a corresponding passgate responsible for coupling one global data line to one local data line. Such an implementation may allow data terminal mapping to be spread out more across a memory array, as compared with implementations that use a column select signal to disable write operations. An ability to spread out data terminal mapping may also improve error correction due to increased isolation between data terminal bits.

During a write operation, write data is received in fixed bit length bursts via data terminals. For example, write data may be received in an eight bit burst over eight data terminals. That is, each of the eight data terminals may receive a respective burst of eight sequential bits. The write data may be error corrected and/or saved in a write buffer in preparation for being written to the memory array. In parallel with receipt of the write data via the data terminals, a mask signal may be received having a same burst length (e.g., an eight-bit burst), with each bit indicating whether the corresponding burst bit received on each of the eight data terminals is to be masked. For example, if a first data mask bit in the burst is set, then the first bit in the respective bursts received at each of the eight data terminals is to be masked or prevented from being written to the memory array.

In the data mask implementation where individual WREN signals are generated, the data mask signal DM may be provided to a column control logic. The column control logic may include a WREN generator that is configured to generate the individual WREN signals to be sent to the memory array based on the data mask signal and the mapping of the data terminals to the memory array. That is, the WREN generator may compare burst of bits received via the DM signal with the data terminal mapping to the memory array, and may set particular ones of the respective WREN signals for data that is to be written to the memory array, and may clear other particular ones of the WREN signals that are to be masked or prevented from being written to the memory array. In some examples, one subset of the WREN signals may be provided to passgates coupled to even sense amplifier stripes and a second, mutually exclusive set of WREN signals may be provided to passgates coupled to odd sense amplifier stripes. The WREN signals may control pass gates that are used to couple global data lines to local data lines. For example, if particular WREN signal is set, then the corresponding pass gate may couple a respective global data line to a respective local data line, which may allow write data to be passed to a sense amplifier for writing to the memory array. If the particular WREN signal is cleared, then the pass gate may decouple the respective global data line from the respective local data line, which may prevent write data from being provided to the sense amplifier. Masking write operations in this way may prevent the sense amplifiers from becoming unstable and flipping data bits stored in the memory array. In addition, this data mask implementation may allow for greater isolation and data terminal mapping to the memory array as compared with use of a column select signal to implement data masking.

FIG. 1 is a schematic block diagram of a semiconductor device 100, in accordance with an embodiment of the present disclosure. For example, the semiconductor device 100 may include a chip 135. The chip 135 may include a clock input circuit 105, an internal clock generator 107, an address command input circuit 115, an address decoder 120, a command decoder 125, a plurality of row decoders 130, a memory cell array 145 including sense amplifiers 150 and transfer gates 195, a plurality of column control logic circuits 140, a plurality of read/write amplifiers 165, an input/output (I/O) circuit 170, and a voltage generator 190. The semiconductor device 100 may include a plurality of external terminals including address and command terminals coupled to command/address bus 110, clock terminals CK and /CK, data terminals DQ, DQS, and DM, and power supply terminals VDD, VSS, VDDQ, and VSSQ. The chip 135 may be mounted on a substrate, for example, a memory module substrate, a mother board or the like.

The memory cell array 145 includes a plurality of banks BANK0-N, each bank BANK0-N including a plurality of word lines WL, a plurality of bit lines BL, and a plurality of memory cells MC arranged at intersections of the plurality of word lines WL and the plurality of bit lines BL. The number of banks BANK0-N may include 2, 4, 8, 16, or any other number of banks. The selection of the word line WL for each bank is performed by a corresponding row decoder 130 and the selection of the bit line BL is performed by a column decoder of a corresponding column control logic circuit 140. The plurality of sense amplifiers 150 are located for their corresponding bit lines BL and coupled to at least one respective local I/O line further coupled to a respective one of at least two main I/O line pairs, via transfer gates TG 195, which function as switches.

The address/command input circuit 115 may receive an address signal and a bank address signal from outside at the command/address terminals via the command/address bus 110 and transmit the address signal and the bank address signal to the address decoder 120. The address decoder 120 may decode the address signal received from the address/command input circuit 115 and provide a row address signal XADD to the row decoder 130, and a column address signal YADD to the column decoder of the corresponding column control logic circuits 140. The address decoder 120 may also receive the bank address signal and provide the bank address signal BADD to the row decoder 130 and the column decoder of the corresponding column control logic circuit 140.

The address/command input circuit 115 may receive a command signal from outside, such as, for example, a memory controller 105 at the command/address terminals via the command/address bus 110 and provide the command signal to the command decoder 125. The command decoder 125 may decode the command signal and provide generate various internal command signals. For example, the internal command signals may include a row command signal to select a word line, a column command signal, such as a read command or a write command, to select a bit line.

Accordingly, when a read command is issued and a row address and a column address are timely supplied with the read command, read data is read from a memory cell in the memory cell array 145 designated by the row address and the column address. The read/write amplifiers 165 may receive the read data DQ and provide the read data DQ to the IO circuit 170. The IO circuit 170 may provide the read data DQ to outside via the data terminals DQ, together with a data strobe signal at DQS and/or a data mask signal at DM. Similarly, when the write command is issued and a row address and a column address are timely supplied with the write command, and then the input/output circuit 170 may receive write data at the data terminals DQ, together with a data strobe signal at DQS and/or a data mask signal at DM and provide the write data via the read/write amplifiers 165 to the memory cell array 145. Thus, the write data may be written in the memory cell designated by the row address and the column address.

During write operations, the column control logic circuits 140 may drive column select CS signals and write enable signals WREN, and the global IO write driver circuit 167 may each drive a respective pair of the global IO lines to complementary logical voltage polarities based on the row and column addresses. The voltage differential between the respective pair of signal lines driven by the main IO write driver circuit 167 may be smaller for a read operation than a write operation. Thus, during a write operation, current consumption to drive the respective pair of global IO lines and to equalize the respective pair of main I/O lines to prepare for a subsequent read or write operation may be greater than drive and equalization current consumption for read operations.

During a write operation, data bits are sent or received via the data terminals DQ over a fixed burst length (e.g., 8, 16, 32, etc., bit burst lengths), in some examples. For example, write data may be received in an 8-bit burst over 8 data terminals DQ. That is, each of the 8 data terminals may receive a respective burst of 8 sequential bits. The write data may be error corrected via the error correction code circuit 166 and/or saved in a write buffer in preparation for being written to the memory array 145. In parallel with receipt of the write data via the data terminals, a data mask DM may be received via the data mask terminal DM having a same fixed-length burst (e.g., an 8-bit burst), with each bit indicating whether the corresponding burst bit received on each of the 8 data terminals DQ is to be masked or prevented from being written to the memory array 145. For example, if a first data mask bit in the burst received via the DM terminal is set, then the first bit in the respective bursts received at each of the eight data terminals DQ is to be masked or prevented from being written to the memory array 145.

In a data mask implementation where multiple WREN signals are generated to mask data write operations, the data mask signal DM may be provided to the column control logic 140. The column control logic 140 may each include a respective WREN generator 142 that is configured to generate the individual WREN signals to be sent to the memory array 145 based on the data mask signal received via the DM terminal and a mapping of the data terminals DQ to the memory array 145. That is, the WREN generator 142 may compare burst of bits received via the data mask signal with the data terminal DQ mapping to the memory array 145, and may set particular ones of the respective WREN signals for data that is to be written to the memory array 145, and may clear other particular ones of the WREN signals that are to be masked or prevented from being written to the memory array 145.

In some examples, one subset of the WREN signals may be provided to the TGs 195 coupled to even sense amplifier stripes and a second, mutually exclusive set of WREN signals may be provided to TGs 195 coupled to odd sense amplifier stripes. The WREN signals may control the TGs 195 that are used to couple global IO lines to local IO lines. For example, if particular WREN signal is set, then the corresponding TG 195 may couple a respective global IO line to a respective local IO line, which may allow write data to be passed to a sense amplifier 150 for writing to the memory array 145. If the particular WREN signal is cleared, then the TG 195 may decouple the respective global IO line from the respective local IO line, which may prevent write data from being provided to the sense amplifier 150. Masking write operations in this way may prevent the sense amplifiers 150 from becoming unstable and flipping data bits stored in the memory array 145. In addition, this data mask implementation may allow for greater isolation and data terminal DQ mapping to the memory array 145, as compared with use of the column select CS signal to implement data masking.

Turning to the explanation of the external terminals included in the semiconductor device 100, the clock terminals CK and /CK may receive an external clock signal and a complementary external clock signal, respectively. The external clock signals (including complementary external clock signal) may be supplied to a clock input circuit 105. The clock input circuit 105 may receive the external clock signals and generate an internal clock signal ICLK. The clock input circuit 105 may provide the internal clock signal ICLK to an internal clock generator 107. The internal clock generator 107 may generate a phase controlled internal clock signal LCLK based on the received internal clock signal ICLK and a clock enable signal CKE from the address/command input circuit 115. Although not limited thereto, a DLL circuit may be used as the internal clock generator 107. The internal clock generator 107 may provide the phase controlled internal clock signal LCLK to the IO circuit 170 and a timing generator 109. The IO circuit 170 may use the phase controller internal clock signal LCLK as a timing signal for determining an output timing of read data.

The power supply terminals may receive power supply voltages VDD and VSS. These power supply voltages VDD and VSS may be supplied to a voltage generator circuit 190. The voltage generator circuit 190 may generate various internal voltages, VPP, VOD, VARY, VPERI, and the like based on the power supply voltages VDD and VSS. The internal voltage VPP is mainly used in the row decoder 130, the internal voltages VOD and VARY are mainly used in the sense amplifiers 150 included in the memory cell array 145, and the internal voltage VPERI is used in many other circuit blocks. The power supply terminals may also receive power supply voltages VDDQ and VSSQ. The IO circuit 170 may receive the power supply voltages VDDQ and VSSQ. For example, the power supply voltages VDDQ and VSSQ may be the same voltages as the power supply voltages VDD and VSS, respectively. However, the dedicated power supply voltages VDDQ and VSSQ may be used for the IO circuit 170 and the ZQ calibration circuit 175.

Figure 2:
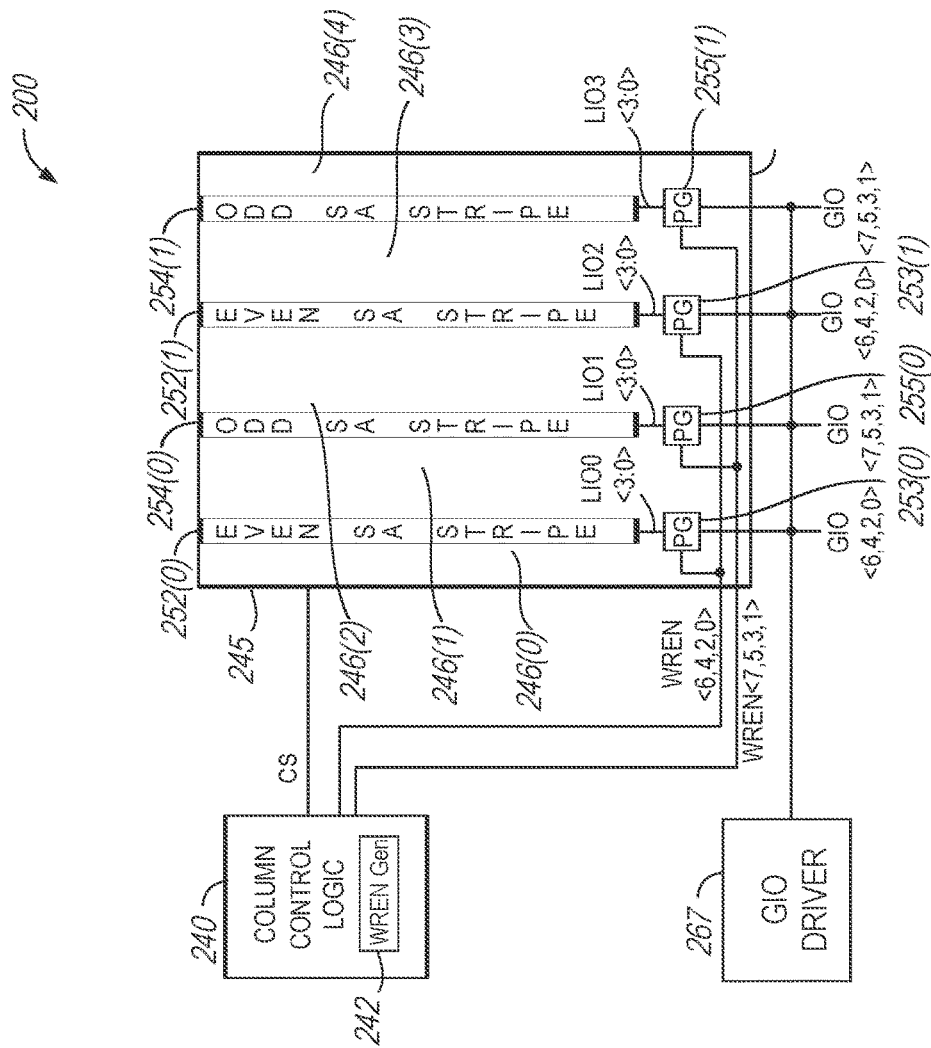
FIG. 2 is a schematic block diagram of a portion of a semiconductor device 200, in accordance with an embodiment of the present disclosure.

FIG. 2 is a schematic block diagram of a portion of a semiconductor device 200, in accordance with an embodiment of the present disclosure. For example, the semiconductor device 200 may include a column control logic 240, and a GIO driver 267 coupled to a memory cell array 245. The memory cell array 245 may include sections or mats 246(0)-(4) of rows of memory cells separated by alternating ones of the even sense amplifier stripes 252(0)-(1) and the odd sense amplifier stripes 254(0)-(1). The even sense amplifier stripes 252(0)-(1) and the odd sense amplifier stripes 254(0)-(1) each include a respective plurality of sense amplifiers that are coupled to respective rows of memory cells on each adjacent side.

The sense amplifiers of the even sense amplifier stripes 252(0)-(1) may be coupled to respective even local IO lines LIO0 and LIO2 and sense amplifiers of the odd sense amplifier stripes 254(0)-(1) may be coupled to respective odd local IO lines LIO1 and LIO3 226. The LIO0-3<3:0> lines may be selectively coupled to respective even and odd global IO lines GIO<7:0> via the passgates 253(0)-(1) and 255(0)-(1). In some examples, the sense amplifiers of the even sense amplifier stripes 252(0)-(1) and the sense amplifiers of the odd sense amplifier stripes 254(0)-(1) may include threshold voltage compensation VtC sense amplifiers configured to perform a threshold voltage compensation operation prior to an access operation to compensate for physical characteristic differences among internal components of each sense amplifier. In some examples, the VtC sense amplifiers may be more susceptible to becoming unstable if coupled to a highly capacitive load, as compared with non-VtC sense amplifiers.

During write operations, the column decoder column control logic 240 may drive column select CS signals and write enable signals WREN<7:0>, and the global IO write driver circuit GIO driver 267 may drive a respective even or odd ones of the global IO lines GIO<7:0> to complementary logical voltage polarities based on the row and column addresses.

The column decoder column control logic 240 may be configured to receive a column address YADD and a bank address BADD, as well as a data mask signal DM<7:0> received via a data mask terminal contemporaneous with receipt of write data via data terminals DQ, where 8 is a fixed burst length. The burst length of 8 is exemplary, and may be less than or greater than 8 in other examples. Based on the YADD and the BADD, the column decoder column control logic 240 may be configured to provide a column select signal CS to the memory cell array 245 to perform a write operation. In addition, the column decoder may include a write enable WREN generator 242 that is configured to generate the individual WREN<7:0> signals to be sent to the memory array memory cell array 245. The WREN generator 242 may generate the WREN<7:0> signals based on the DM<7:0> signal and a mapping of the data terminals DQ to the memory array memory cell array 245. That is, the WREN generator 242 may compare individual bits of the DM<7:0> signal with the data terminal DQ mapping to the memory array memory cell array 245, and may set particular ones of the respective WREN<7:0> signals for data that is to be written to the memory array memory cell array 245, and may clear other particular ones of the WREN<7:0> signals that are to be masked or prevented from being written to the memory array memory cell array 245.

Generally, during a read or write operation, data bits are sent or received via the data terminals over the fixed burst length of 8, in some examples. That is, each of the 8 data terminals may receive a respective burst of 8 sequential bits. The write data may be error corrected in preparation for being written to the memory array memory cell array 245. In parallel with receipt of the write data via the data terminals, the DM<7:0> may be received via the data mask terminal having a same fixed burst length as the write data. Each bit of the DM<7:0> signal may indicate whether the corresponding burst bit received on each of the data terminals is to be masked or prevented from being written to the memory array memory cell array 245.

In some examples, the WREN<3:0> signals may be provided to the even passgates 253(0)-(1) that are coupled to even sense amplifier stripes 252(0)-(1), respectively, and the WREN<7:4> signals may be provided to the odd passgates 255(0)-(1) coupled to the odd sense amplifier stripes odd sense amplifier stripes 254(0)-(1). The WREN<0,2 4,6> signals may control the even passgates 253(0)-(1) that are used to couple even GIO<0,2,4,6> lines to LIO0<3:0> and LIO2<3:0> lines, respectively. The WREN<1,3,5,7> signals may control the odd passgates 255(0)-(1) that are used to couple odd GIO<1,3,5,7> lines to LIO1<3:0> and LIO3<3:0> lines, respectively. In this particular example implementation, the even and odd GIO<7:0> lines and the LIO0-3<3:0> lines may each include 4 individual signal line traces, and each of the even passgates 253(0)-(1) and the odd passgates 255(0)-(1) may include 4 individual passgates configured to couple one respective global IO line trace to a corresponding respective local IO line trace. Each of the individual passgates within each of the even passgates 253(0)-(1) and the odd passgates 255(0)-(1) may be controlled by a different, respective one of the WREN<7:0> signals. For example, the WREN<0> signal may control a first passgate of the even passgates 253(0)-(1), the WREN<1> signal may control a first passgate of the odd passgates 255(0)-(1), etc. In addition, the WREN<2> signal may control a second passgate of the even passgates 253(0)-(1), the WREN<3> signal may control a second passgate of the odd passgates 255(0)-(1). Similarly, the WREN<4> signal may control a third passgate of the even passgates 253(0)-(1), the WREN<5> signal may control a third passgate of the odd passgates 255(0)-(1), etc. In some examples, each of the even passgates 253(0)-(1) and the odd passgates 255(0)-(1) may include a respective set of n-type transistors with a gate coupled to a respective one of the WREN<7:0> signals. In other examples, each of the even passgates 253(0)-(1) and the odd passgates 255(0)-(1) may include a respective set of n-type and p-type transistors coupled in parallel with each gate coupled to a respective one of the WREN<7:0> signals (e.g., n-type transistors) or a respective one of active low WREN<7:0> signals (e.g., p-type transistors).

During a write operation, the GIO driver 267 may drive individual ones of the GIO<7:0> lines according to data terminal mapping to provide write data to be written to the memory array memory cell array 245. If particular one of the WREN<7:0> signals is set, then the corresponding passgate of the even passgates 253(0)-(1) or the odd passgates 255(0)-(1) may couple a respective global IO line to a respective local IO line, which may allow the write data driven on the corresponding GIO<7:0> line to be passed to corresponding LIO0-3<3:0> line for writing to the memory array memory cell array 245. If the particular one of the WREN<7:0> signals is cleared, then the particular passgate of the even passgates 253(0)-(1) or the odd passgates 255(0)-(1) may decouple the respective the corresponding GIO<7:0> line from the corresponding LIO0-3<3:0> line to prevent the write data from being written to the memory array memory cell array 245.

Masking write operations in this way may prevent the sense amplifiers of the even sense amplifier stripes 252(0)-(1) and the odd sense amplifier stripes 254(0)-(1) from becoming unstable and flipping data bits stored in the memory array memory cell array 245. In addition, this data mask implementation may allow for greater isolation and data terminal DQ mapping to the memory array memory cell array 245, as compared with use of the column select CS signal to implement data masking.

Figure 3:
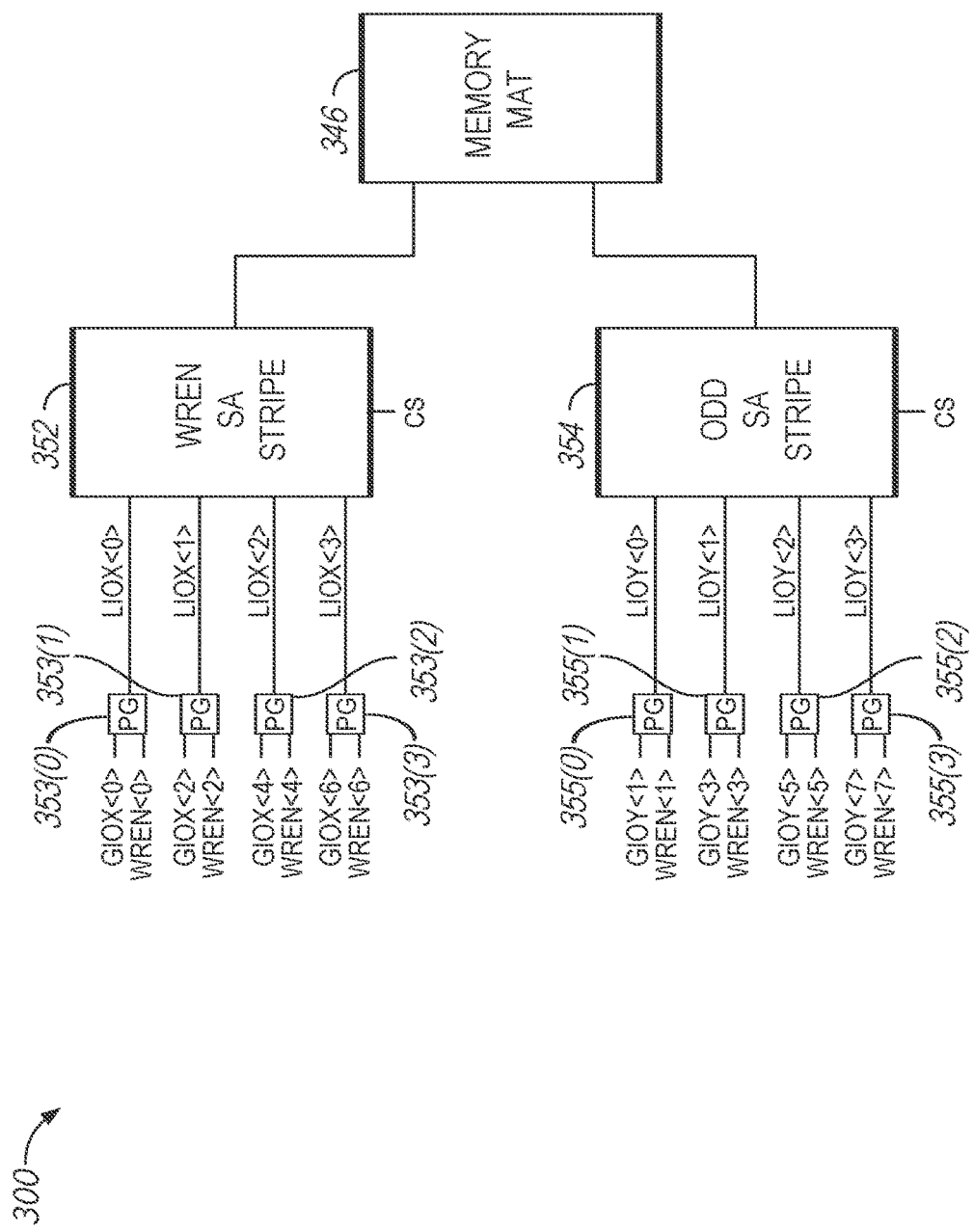
FIG. 3 is a schematic block diagram of a portion of a memory array 300, in accordance with an embodiment of the present disclosure.

FIG. 3 is a schematic block diagram of a portion of a memory array 300, in accordance with an embodiment of the present disclosure. For example, the memory array 300 may include even sense amplifier stripe 352 and an odd sense amplifier stripe 354 each coupled to a memory mat 360. The memory array 300 may further include 353(0)-(3) each configured to couple a respective GIO<0,2,4,6> line to a respective LIOX<3:0> and 355(0)-(3) each configured to couple a respective GIO<1,3,5,7> line to a respective LIOY<3:0>. The LIOX<3:0> lines may be configured to provide write data to and receive read data from the even sense amplifier stripe 352 responsive to a column select signal CS. The LIOY<3:0> lines may be configured to provide write data to and receive read data from the odd sense amplifier stripe 354 responsive to the CS signal. The 145 of FIG. 1 and/or the memory cell array 245 of FIG. 2 may implement the memory array 300, in some examples.

Sense amplifiers of the even sense amplifier stripe 352 may be coupled to the LIOX<3:0> lines and the sense amplifiers of the odd sense amplifier stripe 354 may be coupled to respective LIOY<3:0> lines. In some examples, the sense amplifiers of the even sense amplifier stripe 352 and the sense amplifiers of the odd sense amplifier stripe 354 may include threshold voltage compensation VtC sense amplifiers configured to perform a threshold voltage compensation operation prior to an access operation to compensate for physical characteristic differences among internal components of each sense amplifier. In some examples, the VtC sense amplifiers may be more susceptible to becoming unstable if coupled to a highly capacitive load, as compared with non-VtC sense amplifiers.

The CS signal may be set to perform a write operation based on bank and column address information. The WREN<7:0> signals may be set based on a data mask signal and a mapping of the data terminals DQ to the memory array memory cell array 245. In some examples, the WREN<0,2,4,6> signals may be provided to the even passgates 353(0)-(3) that are coupled to even sense amplifier stripe 352, and the WREN<1,3,5,7> signals may be provided to the odd passgates 355(0)-(3) coupled to the odd sense amplifier stripe odd sense amplifier stripe 354. The WREN<0,2,4,6> signals may control the even passgates 353(0)-(3) that are used to couple GIO<0,2,4,6>-lines to LIOX<3:0> lines, respectively. The WREN<1,3,5,7> signals may control the odd passgates 355(0)-(3) that are used to couple GIO<1,3,5,7> lines to LIOY<3:0> lines, respectively. In this particular example implementation, the even and odd GIO<7:0>, the LIOX<3:0>, and the LIOY <3:0> lines may each include 4 individual signal line traces, but more or fewer signal line traces could be implemented without departing from the scope of the disclosure. In some examples, each of the even passgates 353(0)-(3) and the odd passgates 355(0)-(3) may include a respective n-type transistor with a gate coupled to a respective one of the WREN<7:0> signals. In other examples, each of the even passgates 353(0)-(3) and the odd passgates 355(0)-(3) may include a respective pair of parallel-coupled n-type and p-type transistors with each gate coupled to a respective one of the WREN<7:0> signals (e.g., n-type transistors) or a respective one of active low WREN<7:0> signals (e.g., p-type transistors).

During a write operation, a GIO driver may drive individual ones of the GIO<7:0> lines according to data terminal mapping to provide write data to be written to the memory array 300. If particular one of the WREN<7:0> signals is set, then the corresponding passgate of the even passgates 353(0)-(3) or the odd passgates 355(0)-(3) may couple a respective GIOX<0,2,4,6> or GIO<1,3,5,7> line to a respective LIOX<3:0> or LIOY<3:0> line, which may allow the write data driven on the corresponding respective GIO<0,2,4,6> or GIOY<1,3,5,7> line to be passed to the even sense amplifier stripe 352 or the odd sense amplifier stripe 354. If the particular one of the WREN<7:0> signals is cleared, then the corresponding passgate of the even passgates 353(0)-(3) or the odd passgates 355(0)-(3) may de-couple a respective GIO<0,2,4,6,> or GIO<1,3,5,7> line from a respective LIOX<3:0> or LIOY<3:0> line to prevent the write data from being provided to the even sense amplifier stripe 352 or the odd sense amplifier stripe 354.

Masking write operations in this way may prevent the sense amplifiers of the even sense amplifier stripe 352 and the odd sense amplifier stripe 354 from becoming unstable and flipping data bits stored in the memory mat 360. In addition, this data mask implementation may allow for greater isolation and data terminal DQ mapping to the memory mat 360, as compared with use of the column select CS signal to implement data masking.

FIGS. 4A and 4B depict an exemplary data masking using write enable signals controlled based on mapping of data terminal write data bits to a memory array, in accordance with embodiments of the disclosure. FIG. 4A depicts an exemplary map 400 of the data terminal write data to various control planes of a memory array, in accordance with embodiments of the disclosure. FIG. 4B depicts an exemplary write enable signal generator 442 configured to receive data mask signal data DM<7:0> and a WREN signal, and in response to the WREN signal, to drive the write enable signals WREN<7:0> based of the DM<7:0> data in accordance with embodiments of the disclosure.

In this example, the WREN<0,2,4,6> signals may control the even sense amplifier stripes or gaps and the WREN<1, 3,5,7> signals may control the odd sense amplifier stripes or gaps. In the map, there are 8 data terminals (DQ0-7), and each data terminal DQ may receive 8 bits <7:0>. Each bit of the DM<7:0> data may correspond to a same respective bit of each of the data terminal DQs. For example, DM<4> may correspond to the DQ0-DQ7<4> bits.

As previously described, the WREN<7:0> signals may selectively control the passgates that coupled local I/O lines to global I/O lines during a write operation. The specific map 400 shown in FIG. 4A is exemplary, and other maps may be realized without departing from the scope of the disclosure. In addition, more or fewer than 8 WREN<7:0> signals may be implemented without departing from the scope of the disclosure.

Although the detailed description describes certain preferred embodiments and examples, it will be understood by those skilled in the art that the scope of the disclosure extends beyond the specifically disclosed embodiments to other alternative embodiments and/or uses of the embodiments and obvious modifications and equivalents thereof. In addition, other modifications which are within the scope of the disclosure will be readily apparent to those of skill in the art. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying mode of the disclosed embodiments. Thus, it is intended that the scope of at least some of the present disclosure should not be limited by the particular disclosed embodiments described above.

What is claimed is:

1. An apparatus comprising:
   a memory array comprising a first sense amplifier stripe, a second sense amplifier stripe, and a mat of memory cells formed between the first and second sense amplifier stripe, wherein sense amplifiers of the first sense amplifier stripe are coupled to a first set of local input/output (I/O) lines and sense amplifiers of the second sense amplifier stripe are coupled to a second set of local I/O lines;
   an input/output (I/O) circuit configured to receive write data via a plurality of data terminals and corresponding mask data via a data mask terminal, wherein the mask data indicates which bits of the write data are to be masked from being written to the memory array, wherein storage of the write data at the memory array mat is based on a map to the plurality of data terminals; and
   a column decoder configured to receive the data mask signal, wherein, during a write operation, the column decoder is configured to independently set each of a plurality of write enable signals based on individual bits of the mask data and based on the map of the plurality of data terminals to the memory array mat, wherein a first subset of the plurality of write enable signals are each configured to control provision of a respective portion of the write data to the first plurality of local I/O lines and a second subset of the plurality of write enable signals are configured to control provision of a respective portion of the write data to the second plurality of local I/O lines.

2. The apparatus of claim 1, further comprising:
   a first passgate configured to selectively couple a first local I/O line of the first plurality of local I/O lines to a first global I/O line in response to a first write enable signal of the first subset of the plurality of write enable signals; and
   a second passgate configured to selectively couple a first local I/O line of the second plurality of local I/O lines to a second global I/O line in response to a second first write enable signal of the second subset of the plurality of write enable signals.

3. The apparatus of claim 2, further comprising:
   a third passgate configured to selectively couple a second local I/O line of the first plurality of local I/O lines to a third global I/O line in response to a second write enable signal of the first subset of the plurality of write enable signals; and
   a fourth passgate configured to selectively couple a second local I/O line of the second plurality of local I/O lines to a fourth global I/O line in response to a second write enable signal of the second subset of the plurality of write enable signals.

4. The apparatus of claim 3, wherein, during the write operation and in response to a first bit of the mask data having a no-mask value, the column decoder is further configured to set the first write enable signal of the first subset of the plurality of write enable signals to a first value to cause the first passgate to couple the first local I/O line of the first plurality of local I/O lines to the first global I/O line.

5. The apparatus of claim 4, wherein, during the write operation and in response to a second bit of the mask data having a mask value, the column decoder is further configured to set the second write enable signal of the first subset of the plurality of write enable signals to a second value to cause the third passgate to de-couple the second local I/O line of the first plurality of local I/O lines from the third global I/O line.

6. The apparatus of claim 2, further comprising a write driver circuit configured to drive respective portions of the write data on the first, second, Third, and fourth global I/O lines, respectively.

7. The apparatus of claim 1, wherein, during the write operation, the column decoder is further configured to provide a column select signal to control provision of the write data to each of the first and second pluralities of local I/O lines.

8. The apparatus of claim 1, wherein, during a fixed-length burst period, the input/output (I/O) circuit is configured to receive a first subset of bits of the write data at a first data terminal of the plurality of data terminals, a second subset of bits of the write data at a first data terminal of the plurality of data terminals, and each bit of the mask data at the data mask terminal.

9. The apparatus of claim 1, wherein, during a write operation within a same control plane of the memory array mat, the column decoder is configured to set the plurality of write enable signals to contemporaneously cause a first bit of the write data to be written to a first memory cell of the memory array mat and to cause a second bit of the write data to be masked from being written based on the mask data.

10. A memory comprising:
a plurality of global input/output (I/O) lines coupled to a memory cell array;
a first plurality of local I/O lines within the memory cell array coupled to a first sense amplifier stripe;
a second plurality of local I/O lines within the memory cell array coupled to a second sense amplifier stripe;
a first plurality of passgates each configured to selectively couple a respective one of the first plurality of local I/O lines to a respective one of a first subset of the global I/O lines in response to a respective one of a first plurality of write enable signals;
a second plurality of passgates each configured to selectively couple a respective one of the second plurality of local I/O lines to a respective one of a second subset of the global I/O lines in response to a respective one of a second plurality of write enable signals; and
a column decoder configured to set the first and second pluralities of write enable signals based on a data mask signal and a map of data terminal bits to the memory cell array during a write operation.

11. The memory of claim 10, further comprising:
a third plurality of local I/O lines within the memory cell array coupled to a third sense amplifier stripe;
a fourth plurality of local I/O lines within the memory cell array coupled to a fourth sense amplifier stripe;
a third plurality of passgates each configured to selectively couple a respective one of the third plurality of local I/O lines to a respective one of a third subset of the global I/O lines in response to a respective one of the first plurality of write enable signals;
a fourth plurality of passgates each configured to selectively couple a respective one of the fourth plurality of local I/O lines to a respective one of a fourth subset of the global I/O lines in response to a respective one of the second plurality of write enable signals.

12. The memory of claim 10, wherein, during the write operation and in response to a first bit of the mask data having a no-mask value, the column decoder is further configured to set a first write enable signal of the first plurality of write enable signals to a first value to cause a first passgate of the first plurality of passgates to couple a first local I/O line of the first plurality of local I/O lines to a first global I/O line of the first subset of the global I/O lines.

13. The memory of claim 12, wherein, during the write operation and in response to a second bit of the mask data having a mask value, the column decoder is further configured to set a second write enable signal of the first plurality of write enable signals to a second value to cause a second passgate of the first plurality of passgates to decouple a second local I/O line of the first plurality of local I/O lines from a second global I/O line of the first subset of the global I/O lines.

14. The apparatus of claim 10, further comprising a write driver circuit configured to drive respective portions of write data on the plurality of global I/O lines during the write operation.

15. A method comprising:
during a write operation at a memory:
receiving, during a fixed-length burst period, respective portions of write data via individual terminals of a plurality of data terminals and mask data via a data mask terminal;
providing, to a first plurality of passgates coupled to first local input/output lines of a first sense amplifier stripe, a first plurality of write enable signals each independently set based on individual bits of the mask data and a map of first data bits of the write data received via the plurality of data terminals to memory cells of a memory array to control write masking of the first data bits of the write data;
providing, to a second plurality of passgates coupled to second local input/output lines of a second sense amplifier stripe, a second plurality of write enable signals each independently set based on individual bits of the mask data and a map of first data bits of the write data received via the plurality of data terminals to memory cells of a memory array to control write masking of the second data bits of the write data.

16. The method of claim 15, further comprising:
selectively coupling a first local I/O line of the first local I/O lines to a first global I/O line via a first passgate of the first plurality of passgates in response to a first write enable signal of the first plurality of write enable signals; and
selectively coupling a second local I/O line of the second local I/O lines to a second global I/O line via a second passgate of the second plurality of passgates in response to a second write enable signal of the second plurality of write enable signals.

17. The method of claim 16, further comprising:
selectively coupling a second local I/O line of the first local I/O lines to a third global I/O line via a third passgate of the first plurality of passgates in response to a second write enable signal of the first plurality of write enable signals; and
selectively coupling a second local I/O line of the second local I/O lines to a fourth global I/O line via a fourth passgate of the second plurality of passgates in response to a second write enable signal of the second plurality of write enable signals.

18. The method of claim 17, further comprising, in response to a first bit of the mask data having a no-mask value, setting the first write enable signal of the first plurality of write enable signals to a first value to cause the first passgate of the first plurality of passgates to couple the first local I/O line of the first local I/O lines to the first global I/O line.

19. The method of claim 18, further comprising, in response to a second bit of the mask data having a mask value, setting the second write enable signal of the first plurality of write enable signals to a second value to cause the third passgate of the first plurality of passgates to de-couple the third local I/O line of the first local I/O lines from the third global I/O line.

20. The method of claim 16, further comprising driving first and second portions of the write data on the first and second global I/O lines, respectively.

21. The method of claim 15, further comprising, during the write operation, providing a column select signal to control provision of the write data to each of the first and second local I/O lines.

* * * * *